United States Patent
Pan

(10) Patent No.: US 6,699,761 B2
(45) Date of Patent: Mar. 2, 2004

(54) METHOD FOR FABRICATING Y-DIRECTION, SELF-ALIGNMENT MASK ROM DEVICE

(75) Inventor: Jen-Chuan Pan, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 90 days.

(21) Appl. No.: 10/064,396

(22) Filed: Jul. 10, 2002

(65) Prior Publication Data

US 2003/0235955 A1 Dec. 25, 2003

(30) Foreign Application Priority Data

Jun. 20, 2002 (TW) .......................................... 91113448 A

(51) Int. Cl.⁷ ............................................ H01L 21/336
(52) U.S. Cl. ........................ 438/289; 438/266; 438/270
(58) Field of Search .......................... 438/289, 266, 438/270, 257–259, 262–269

(56) References Cited

U.S. PATENT DOCUMENTS 5,691,216 A * 11/1997 Yen et al. ..................... 437/45
6,251,731 B1 * 6/2001 Wu ............................. 438/275
6,440,798 B1 * 8/2002 Lai et al. .................... 438/266

\* cited by examiner

*Primary Examiner*—Carl Whitehead, Jr.
*Assistant Examiner*—Yennhu Huynh
(74) *Attorney, Agent, or Firm*—Jiang Chyun IP Office

(57) ABSTRACT

A method for fabricating a y-direction, self-alignment mask ROM device is described. The method includes forming a buried drain region in a substrate and forming a gate oxide layer on the substrate. Perpendicular to the direction of the buried drain region, a bar-shaped silicon nitride layer is formed on the gate oxide layer. A photoresist layer is then formed on the gate oxide layer and the bar-shaped silicon nitride layer. Performing a code implantation to form a plurality of coded memory cells using the photoresist layer as a mask. The photoresist layer is then removed. A polysilicon layer is further formed on the gate oxide layer and the bar-shaped silicon nitride layer. The polysilicon layer is back-etched until the bar-shaped silicon nitride layer is exposed. The silicon nitride layer is subsequently removed.

9 Claims, 5 Drawing Sheets

METHOD FOR FABRICATING Y-DIRECTION, SELF-ALIGNMENT MASK ROM DEVICE

CROSS REFERENCE TO RELATED APPLICATIONS

This application claims the priority benefit of Taiwan application serial no. 91113448, filed Jun. 20, 2002.

BACKGROUND OF INVENTION

Field of the Invention

The present invention relates to a fabrication method for a memory device. More particularly, the present invention relates to a method for fabricating a y-direction, self-alignment mask read-only memory (ROM) device.

Background of the Invention

Referring to FIG. 1A, the conventional fabrication process of a mask ROM device includes providing a substrate 100. A gate oxide layer 102 is then formed on the surface of the substrate 100. Using a patterned photoresist layer 103 as a mask, an ion implantation process 106 is conducted to form a buried drain region 108 in the substrate 100 as the bit line.

FIGS. 1A to 1C are schematic, cross-sectional views, illustrating the conventional fabrication process of a mask ROM device, wherein FIGS. 1B and 1C are views of a plane perpendicular to the plane in FIG. 1A.

Referring to FIG. 1A, the conventional fabrication process of a mask ROM device includes providing a substrate 100. A gate oxide layer 102 is then formed on the surface of the substrate 100. Using a patterned photo layer 104 as a mask, an ion implantation process 106 is conducted to form a buried drain region 108 in the substrate 100 as the bit line.

Referring to FIG. 1B, after removing the patterned photoresist layer 103, a patterned polysilicon layer 104 is formed on the gate oxide layer 102 as the word line. A patterned photoresist layer 110 is formed on the substrate 100, exposing a channel region 114 to be coded by implantation. Further using the photoresist layer 110 as a mask, a code implantation 112 is performed to implant dopants in the channel region 114.

Thereafter, as shown in FIG. 1C, the photoresist layer 110 is removed to complete the manufacturing of a mask ROM device.

However, the mask ROM device formed by the conventional approach, the coding implantation step is performed after the formation of the polysilicon layer (word line). To reach the channel region, the implantation of the coding implantation step needs to go through the polysilicon layer. Diffusion of dopants thus easily occurs to limit the reduction of the device dimension. Moreover, the mask that is being used for the ion implantation of the conventional coding implantation process is formed directly on the gate oxide layer. When a misalignment occurs between the memory device and the coding mask, ions are not implanted to the appropriate region, and the tail bit effect is generated. Therefore, the cell window of the memory device can not be increased.

SUMMARY OF INVENTION

The present invention provides a method to fabricate a y-direction, self-alignment mask read-only memory device, wherein the device dimension can be reduced.

The present invention also provides a fabrication method for a y-direction, self-alignment mask read-only memory device, wherein the tail bit effect generated in the conventional mask ROM device formed to increase the cell window of a memory device.

The present invention provides a fabrication method for a y-direction, self-alignment mask ROM device, wherein a patterned first photoresist layer is formed on a substrate and a first ion implantation is performed to form a buried drain region in the substrate using the first photoresist layer as a mask. Subsequent to the removal of the first photoresist layer, a gate oxide layer is formed on the surface of the substrate. A silicon nitride bar that is perpendicular to a direction of the buried drain region is then formed on the gate oxide layer. A patterned second photoresist layer is then formed on the gate oxide layer and the bar-shaped silicon nitride layer. Further using the second photoresist layer as ion implantation mask, a code implantation process is conducted to form a plurality of coded memory cells. The second photoresist layer is then removed, follow by forming a polysilicon layer on the gate oxide layer and on the bar-shaped silicon nitride layer. A portion of the polysilicon layer is removed until the bar-shaped silicon nitride layer is exposed by back-etching or chemical mechanical polishing. A metal silicide layer is further formed on the surface of the polysilicon layer. The bar-shaped silicon nitride layer is subsequently removed.

The present invention provides a method for fabricating a y-direction, self-alignment mask ROM device. The method includes providing a substrate, wherein the substrate comprises a memory cell region and a peripheral circuit region. Moreover, an isolation structure is already formed in the peripheral circuit region to define an active region. A first patterned photoresist layer is then formed on the substrate, covering the entire peripheral circuit region and exposing the part of the substrate that is going to be formed as the buried drain region in the memory cell region. After this, a buried drain region is formed in the substrate of the memory cell region, using the first photoresist layer as an ion implantation mask. A gate oxide layer is then formed on the surface of the substrate subsequent to the removal of the first photoresist layer. A patterned silicon nitride layer is then formed on the gate oxide layer, wherein the silicon nitride layer in the memory cell region includes a plurality of bar-shaped silicon nitride layers formed perpendicular to the buried drain region, while the silicon nitride layer in the peripheral circuit region exposes the gate oxide layer. A second patterned photoresist layer is then formed on the silicon nitride layer and the gate oxide layer. The second photoresist layer exposes a channel region in the memory cell region that is to be code implanted while covers the entire peripheral circuit region. Using the second photoresist as an ion implantation mask, a code implantation is performed to form a plurality of coded memory cells in the memory cell region. Thereafter, the second photoresist layer is removed, followed by forming a polysilicon layer on the gate oxide layer and the silicon nitride layer. Back-etching or chemical mechanical polishing is further conducted to remove a part of the polysilicon layer until the silicon nitride layer is exposed. A metal silicide layer is formed on the surface of the polysiliocn layer. The silicon nitride layer is then removed. The polysilicon and the metal silicide structure in the memory cell region forms a word line, while the polysilicon and metal silicide structure in the peripheral circuit region serves as a gate.

According to the fabrication method of a y-direction, self-alignment mask ROM device of the present invention, the bar-shaped silicon nitride layer that is perpendicular to the buried drain region forms on the gate oxide layer. Even a misalignment occurs between the coding mask and the memory device, the bar-shaped silicon nitride layer can prevent the dopants of the code implantation to be implanted at the wrong region. The present invention can thus provide the y-direction, self-alignment effect.

According to the fabrication method for a y-direction, self-alignment mask ROM device of the present invention, the coding implantation is performed before the formation of the word line, the code implantation of the channel region can achieve without having to pass through the word line to prevent the diffusion of dopants.

With the y-direction, self-alignment effect, the fabrication method for a mask ROM device of the present invention can prevent the generation of tail bit effect as in the conventional practice to increase the cell window of a memory device.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1A to 1C are schematic, cross-sectional views illustrating the conventional fabrication method for a mask ROM device, wherein FIGS. 1B and 1C are views of a plane perpendicular to the plane in FIG. 1A;

FIG. 2 is a schematic top view of a y-direction, self-alignment mask ROM device according to one embodiment of the present invention; and.

DETAILED DESCRIPTION

Figure 1A:
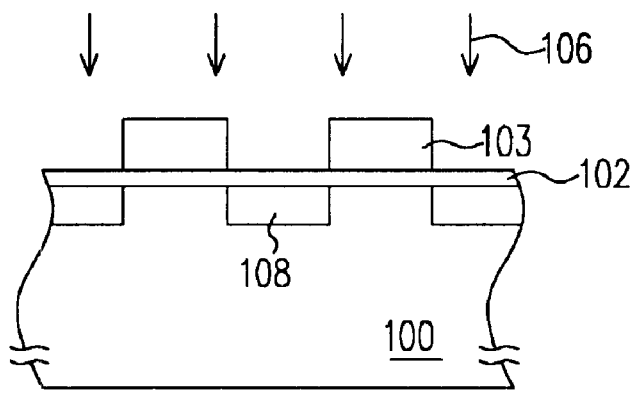
Figure 1B:
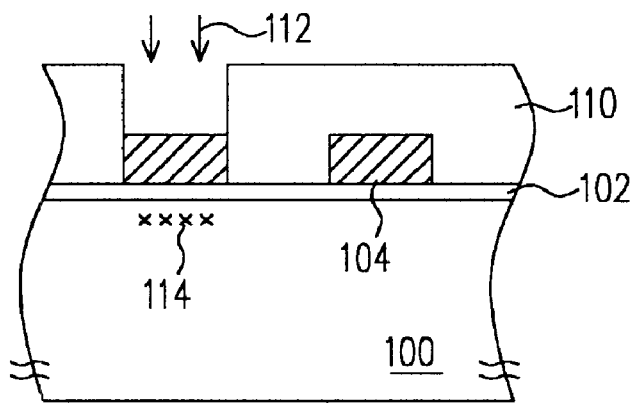
Figure 1C:
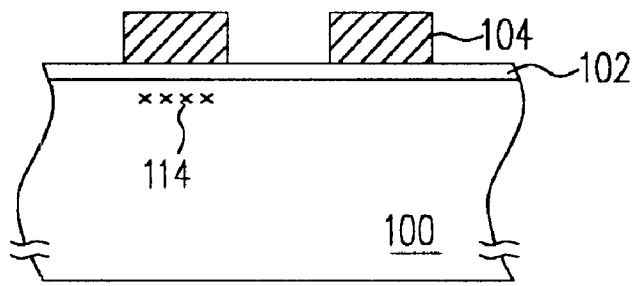
Figure 2:
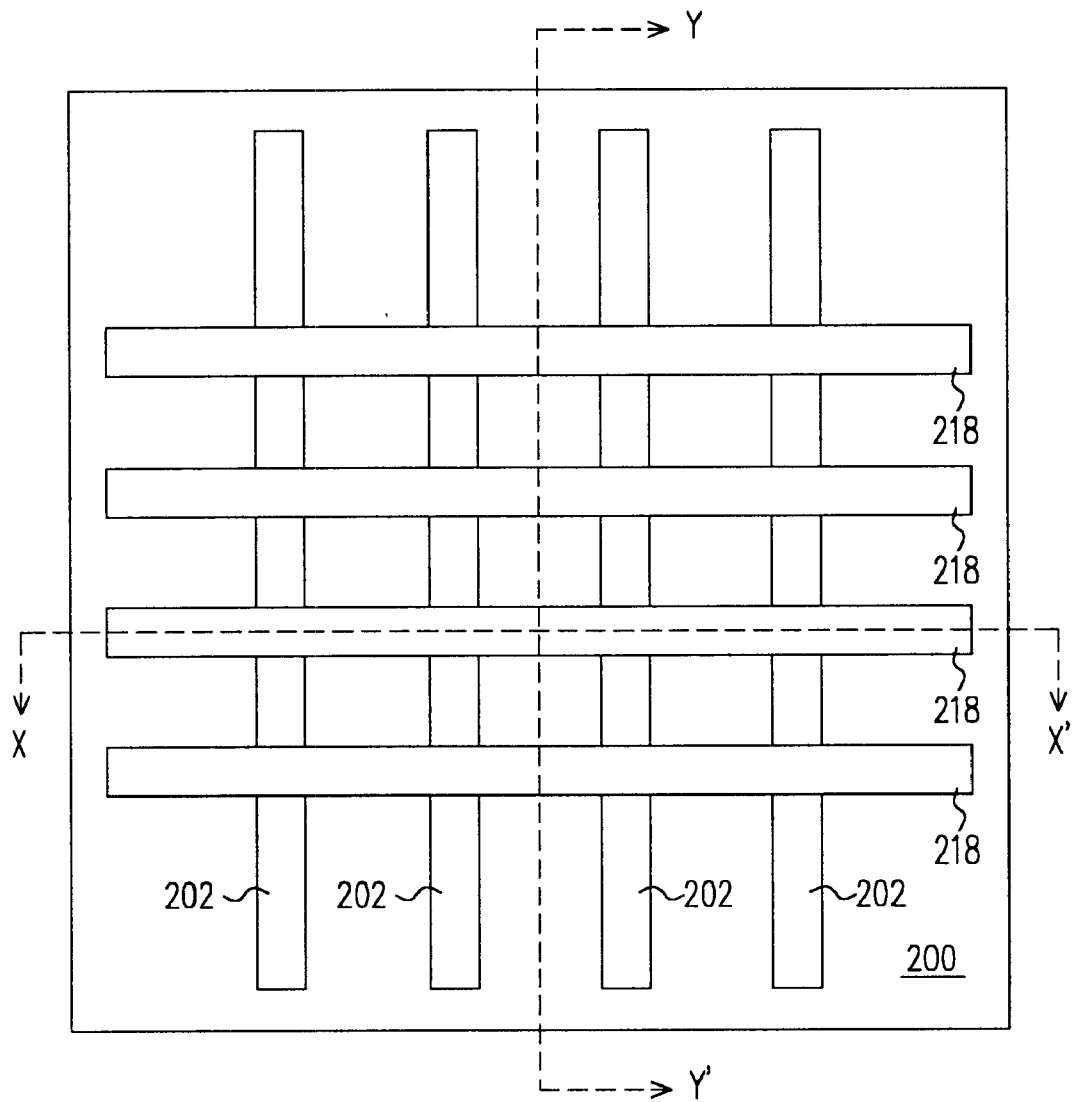

FIG. 2 is a schematic top view of a y-direction, self-alignment mask ROM device according to one embodiment of the present invention. FIGS. 3A to 3I are schematic, cross-sectional views of FIG. 2 along the X–X" and Y–Y" lines to illustrate the fabrication process for a y-direction, self-alignment mask ROM device according to the one embodiment of the present invention.

Figure 3A:
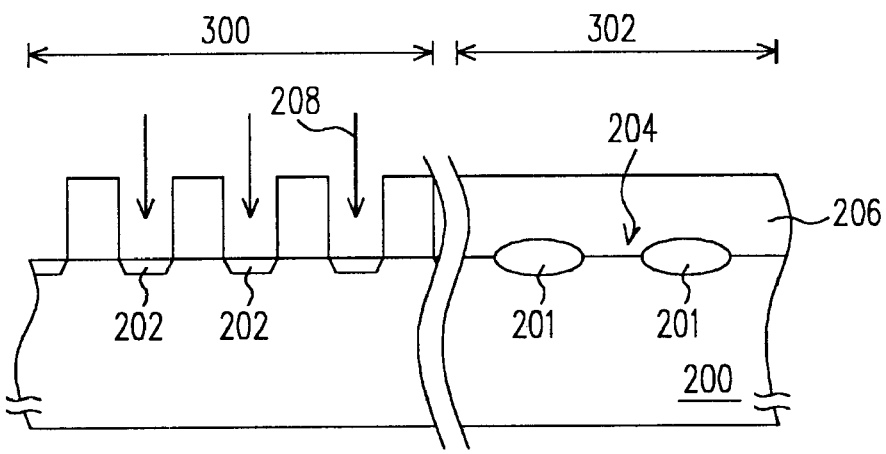
FIGS. 3A to 3I are schematic, cross-sectional views illustrating the fabrication process for a y-direction, self-alignment mask ROM device according to the one embodiment of the present invention.

Referring to FIG. 2 and FIG. 3A, FIG. 3A is the cross-sectional view of FIG. 2 along the X–X" line. The fabrication method for a y-direction, self-alignment mask ROM device of the present invention provides a substrate 200, wherein the substrate 200 comprises a memory cell region 300 and a peripheral circuit region 302. An isolation structure 201 is already formed in the peripheral circuit region 302 to define an active region 204. The isolation structure 201 is, for example, a field oxide isolation structure or a shallow trench isolation structure.

A patterned photoresist layer 206 is formed on the substrate 200, wherein the bottom of the photoresist layer 206 further comprises an anti-reflecting coating (not shown). The photoresist layer 206 in the memory cell region 300 exposes the substrate 200 where the buried drain region is going to be formed, while the photoresist layer 206 covers the entire peripheral circuit region 302. Using the photoresist layer 206 as a mask, an ion implantation process 208 is conducted to form a buried drain region 202 in the substrate 200 of the memory cell region 300 as the bit line. The ion implantation process 208 is conducted at an energy level of about 80 keV and the dopants implanted for the buried drain region 202 include arsenic ions.

Figure 3B:
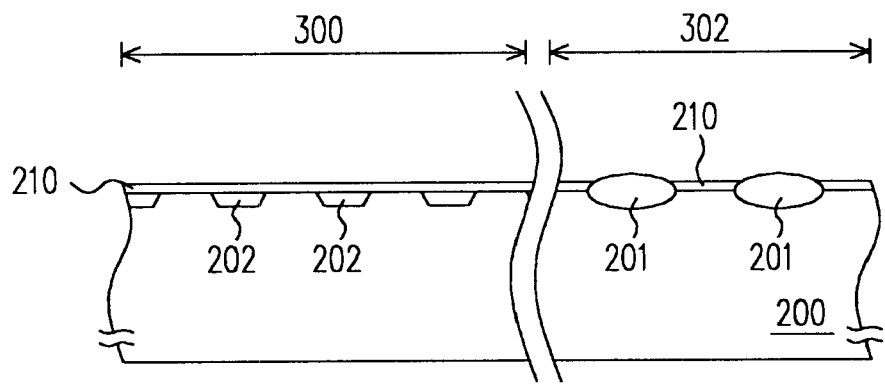

Referring to FIG. 3B, FIG. 3B is a cross-sectional of FIG. 2 along the X–X" line. Subsequent to the formation of the buried drain region 202, the photoresist layer 206 is removed. A gate oxide layer 210 is then formed on the substrate 200. The gate oxide layer 210 is about 30 to 70 angstroms thick.

Figure 3C:
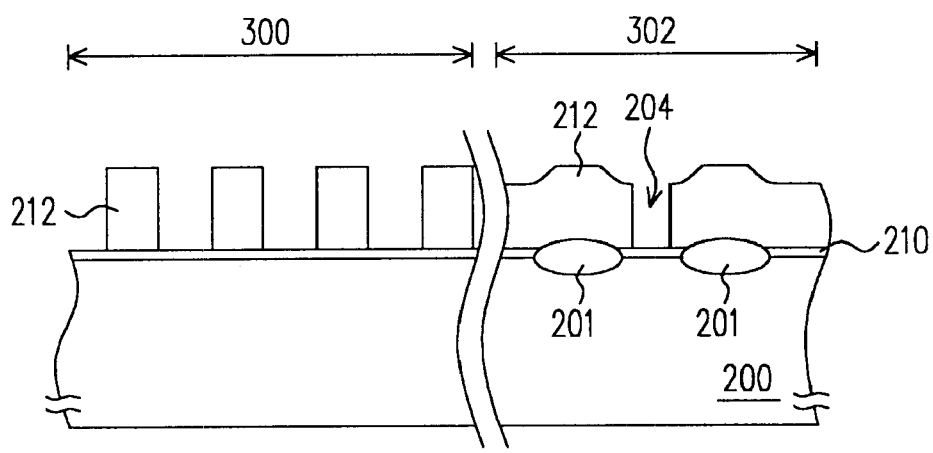

Continuing to FIG. 3C, FIG. 3C is a cross-sectional view of FIG. 2 along the Y–Y" line. A patterned dielectric layer 212 is formed on the gate oxide layer 210, wherein the patterned dielectric layer 212 is, for example, a silicon nitride layer of about 1500 angstroms to about 2500 angstroms thick. The silicon nitride layer 212 in the memory cell region 300 includes a plurality of bar-shaped silicon nitride layers 212 that are perpendicular to the buried drain region 202. The silicon nitride layer 212 in the peripheral circuit region 302, however, exposes the gate oxide layer 210 in the active region 204.

Figure 3D:
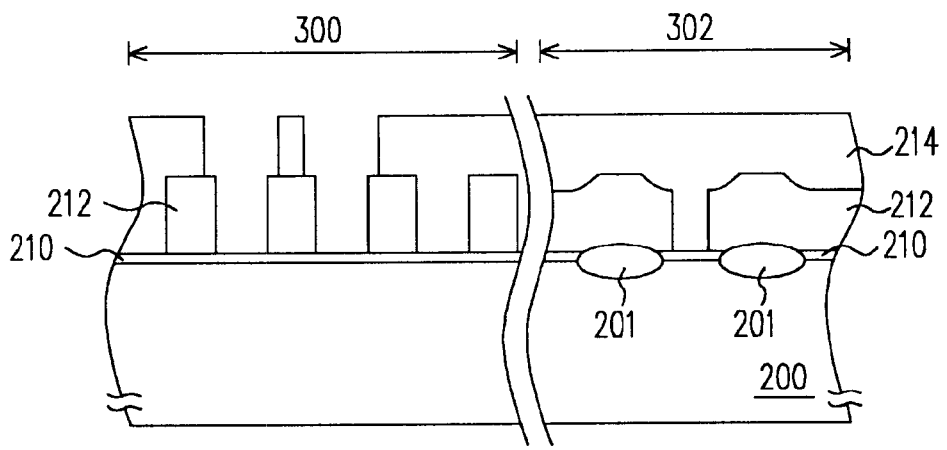

Referring to FIG. 3D, which is a cross-sectional view of FIG. 2 along the Y–Y" line, a patterned photoresist layer 214 is then formed on the gate oxide layer 210 and the silicon nitride layer 212. The bottom of the patterned photoresist layer 214 further comprises an anti-reflecting coating (now shown). The photoresist layer 214 exposes a channel region that is to be coded in the memory cell region 300, while the entire peripheral circuit region 302 is covered.

Figure 3E:
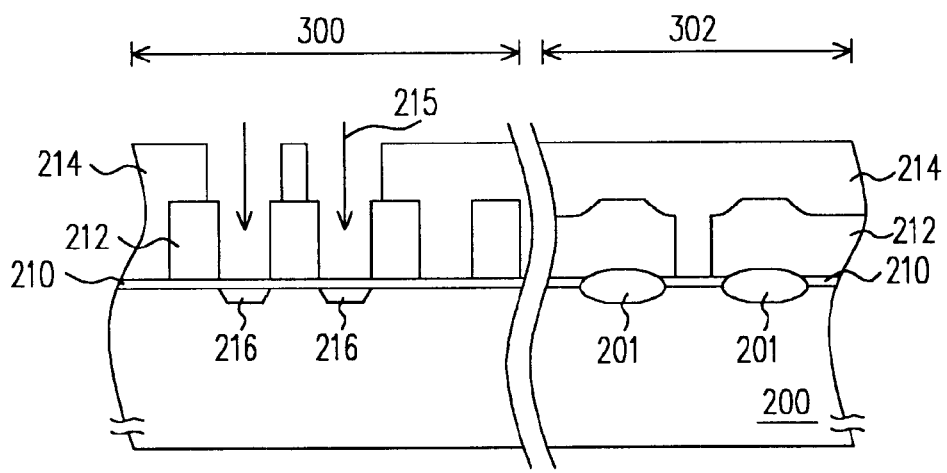

After this, refer to FIG. 3E, wherein FIG. 3E is a cross-sectional view of FIG. 2 along the Y–Y" line. Using the photoresist layer 214 as a mask, a code implantation 215 is conducted to implant ions to the channel region 216 for forming a plurality of coded memory cell in the memory cell region 300. The code implantation 215 implants a dopant, such as boron, at an energy of about 10 keV. Since the coded memory cells that are implanted with boron have a higher threshold voltage, they assume a logic state of "0". The coded memory cells that are not implanted with boron thus assume a logic state of "1".

Figure 3F:
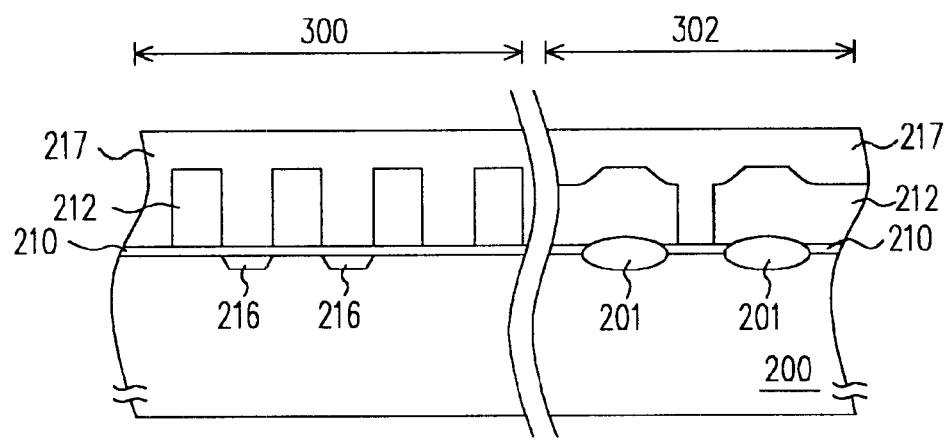

As shown in FIG. 3F, where FIG. 3F is a cross-sectional view of FIG. 2 along the Y–Y" line, subsequent to the removal of the photoresist layer 214, a conductive layer 217 is formed on the gate oxide layer 210 and the silicon nitride layer 212. The conductive layer 217 is, for example, a polysilicon layer of about 3000 angstroms to about 5000 angstroms thick.

Figure 3G:
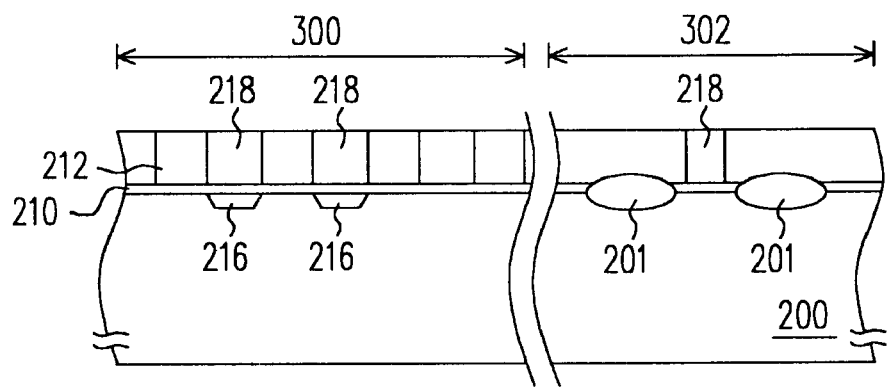

Referring to FIG. 3G, where FIG. 3G is a cross-sectional view of FIG. 2 along the Y–Y" line. A portion of the conductive layer 217 is removed until the silicon nitride layer 212 is exposed to form a conductive structure 218, wherein the portion of the conductive layer 217 is removed by back-etching or chemical mechanical polishing. The conductive structure 218 is about 600 to 1500 angstroms thick. The conductive structure 218 in the memory cell region 300 serves as a word line, while the conductive structure 218 in the peripheral circuit region 302 functions as a gate structure.

Figure 3H:
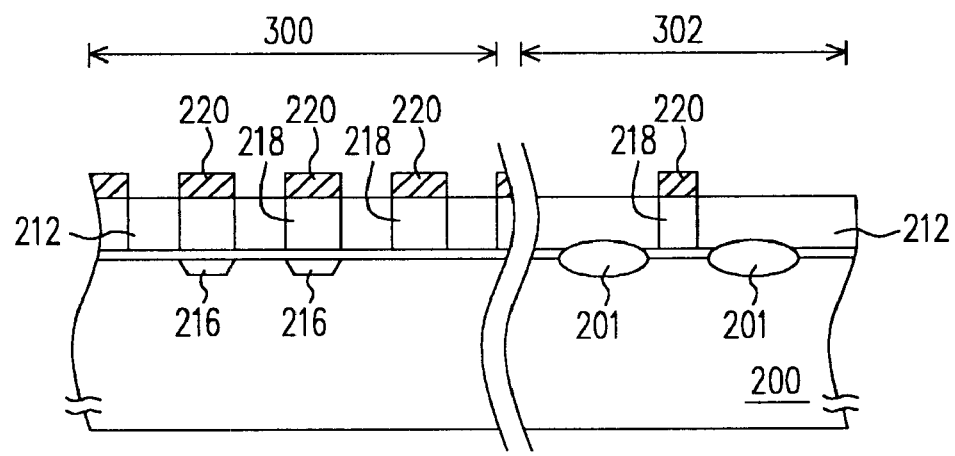
Figure 3I:
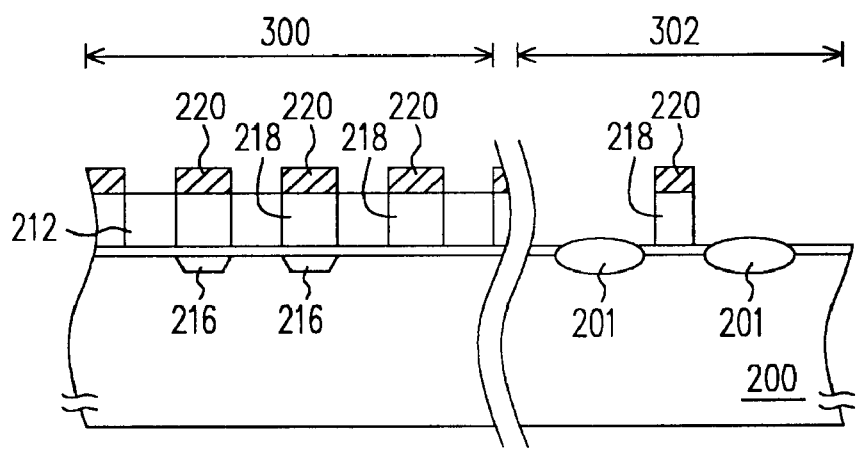

After this, as shown in FIG. 3H, where 3H is a cross-sectional view of FIG. 2 along the Y–Y" line, the present invention further comprises forming a metal silicide layer 220 on the polysilicon type of conductive structure 218 to lower the resistance of the word line in the memory cell region 300 and the resistance of the gate structure in the peripheral circuit region 302. The metal silicide layer 220 is formed by, for example, forming a metal layer (not shown) on the polysilicon conductive structure 218 and silicon nitride layer 212, followed by performing a thermal process to induce a reaction between the metal layer and the polysilicon layer to form a metal silicide layer. The unreacted metal layer is subsequently removed.

Thereafter, as shown in FIG. 31 where 31 is a cross-sectional view of FIG. 2 along the Y–Y" line, the silicon nitride layer 212 is removed to complete the fabrication of a mask ROM device of the present invention.

According to the fabrication method for a mask ROM device of the present invention, a bar-shaped silicon nitride layer that is perpendicular to the buried drain region is formed on the gate oxide layer 210. Therefore, even a misalignment occurs between the coding masking and the memory device, the dopants for the code implantation process are implanted to the bar-shaped silicon nitride layer and will not be wrongly implanted to other region in the substrate 200. In other words, the bar-shaped silicon nitride layer 212 can prevent the dopants of the code implantation to be implanted to an inappropriate region of the substrate 200. The y-direction, self-alignment effect is thus provided. Moreover, since the code implantation is performed before the formation of the word line 218 according to the y-direction, self-alignment mask ROM fabrication method of the present invention, the diffusion of dopants can be prevented. Further, due to the y-direction, self-alignment effect of the fabrication method of the present invention, the tail bit effect generated in the conventional fabrication method can be prevented to increase the cell window of a memory device while the device dimension can be reduced.

Based on the foregoing description, the fabrication method of a mask ROM device of the present invention provides a y-direction, self-alignment effect.

The y-direction, self-alignment mask ROM device formed according to the present invention, the diffusion of dopants easily generated in the conventional code implantation can be prevented. The device dimension can thereby be reduced.

The y-direction, self-alignment mask ROM device formed according to the present invention, the tail bit effect easily generated in the conventional practice is prevented to increase the cell window of a memory device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a y-direction, self-alignment mask ROM device, comprising:
   forming a buried drain region in a substrate;
   forming a gate oxide layer on the substrate;
   forming a bar-shaped dielectric layer on the gate oxide layer, the bar-shaped dielectric layer is perpendicular to a direction of the buried drain region;
   forming a patterned photoresist layer on the substrate;
   performing a code implantation to form a plurality of coded memory cells using the photoresist layer as a mask;
   removing the photoresist layer after performing the code implantation;
   forming a conductive layer on the substrate after performing the code implantation and removing the photoresist layer;
   removing a portion of the conductive layer until the bar-shaped dielectric layer is exposed; and
   removing the bar-shaped dielectric layer.

2. The method of claim 1, wherein the bar-shaped dielectric layer includes a bar-shaped silicon nitride layer.

3. The method of claim 1, wherein the bar-shaped dielectric layer is about 1500 to 2500 angstroms thick.

4. The method of claim 1, wherein the conductive layer includes a polysilicon layer.

5. The method of claim 4, wherein subsequent to removing the portion of the polysilicon layer until the bar-shaped silicon nitride layer is exposed further comprises forming a metal silicide layer on a surface of the polysilicon layer.

6. The method of claim 1, wherein dopants for the code implantation include boron ions.

7. The method of claim 1, wherein the coding implantation is conducted at an energy of about 10 keV.

8. The method of claim 1, wherein removing the portion of the conductive layer includes performing back-etching or chemical-mechanical polishing.

9. The method of claim 1, wherein a bottom of the photoresist layer further comprises an anti-reflecting coating.

* * * * *